US011218804B2

(12) United States Patent
Berthelsen et al.

(10) Patent No.: US 11,218,804 B2
(45) Date of Patent: Jan. 4, 2022

(54) SYSTEM AND METHOD FOR CALIBRATING MICROPHONE CUT-OFF FREQUENCY (71) Applicant: KNOWLES ELECTRONICS, LLC, Itasca, IL (US)

(72) Inventors: Kim Spetzler Berthelsen, Koego (DK); Mohammad Shajaan, Værløse (DK); Claus Fürst, Roskilde (DK)

(73) Assignee: Knowles Electronics, LLC, Itasca, IL (US)

(*) Notice: Subject to any disclaimer, the term of this patent is extended or adjusted under 35 U.S.C. 154(b) by 154 days.

(21) Appl. No.: 16/479,718

(22) PCT Filed: Feb. 8, 2018

(86) PCT No.: PCT/US2018/017458
§ 371 (c)(1),
(2) Date: Jul. 22, 2019

(87) PCT Pub. No.: WO2018/152003
PCT Pub. Date: Aug. 23, 2018

(65) Prior Publication Data
US 2021/0136493 A1 May 6, 2021

Related U.S. Application Data (60) Provisional application No. 62/459,031, filed on Feb. 14, 2017.

(51) Int. Cl.
H04R 3/04 (2006.01)
H03G 5/28 (2006.01)
H03G 3/30 (2006.01)

(52) U.S. Cl.
CPC .............. H04R 3/04 (2013.01); H03G 3/301 (2013.01); H03G 5/28 (2013.01)

(58) Field of Classification Search
CPC ............. H04R 3/04; H03G 3/301; H03G 5/28
(Continued)

(56) References Cited

U.S. PATENT DOCUMENTS 5,600,615 A 2/1997 Kiyoura et al.
7,190,038 B2 3/2007 Dehe et al.
(Continued)

FOREIGN PATENT DOCUMENTS

EP 1 791 393 A1 5/2007
JP 2002-182682 A 6/2002
JP 2003-264892 A 9/2003

OTHER PUBLICATIONS

International Search Report and Written Opinion, PCT/US2018/017458, Knowles Electronics, LLC (dated Apr. 25, 2018).

Primary Examiner — Paul Kim
Assistant Examiner — Friedrich Fahnert
(74) Attorney, Agent, or Firm — Foley & Lardner LLP (57) ABSTRACT A system and method in an audio signal electrical circuit including a feedback loop with a digital filter coupled to a current digital to analog converter (IDAC) includes providing an output signal from the IDAC to analog elements of the audio signal electrical circuit, the output signal from the IDAC based upon a reference signal input to the IDAC when an output of the digital filter is not input to the IDAC. The system and method also include comparing an output signal of the audio signal electrical circuit to a reference, and calibrating the audio signal electrical circuit to correspond the output signal of the audio signal electrical circuit to the reference. Calibration of the audio signal electrical circuit enables more precise control of a cut-off frequency of a microphone signal when the output of the digital filter is input to the IDAC.

19 Claims, 8 Drawing Sheets (58) Field of Classification Search
USPC .......................................... 381/98, 111–115
See application file for complete search history.

(56) References Cited

U.S. PATENT DOCUMENTS

| | | |
|---|---|---|
| 7,473,572 B2 | 1/2009 | Dehe et al. |
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 9,831,844 B2 | 11/2017 | Yurrtas et al. |
| 2003/0235315 A1 | 12/2003 | Reesor |
| 2005/0207605 A1 | 9/2005 | Dehe et al. |
| 2007/0278501 A1 | 12/2007 | Macpherson et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2010/0046780 A1 | 2/2010 | Song |
| 2010/0052082 A1 | 3/2010 | Lee et al. |
| 2010/0128914 A1 | 5/2010 | Khenkin |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0051954 A1 | 3/2011 | Thomsen et al. |
| 2011/0075875 A1 | 3/2011 | Wu et al. |
| 2012/0038500 A1* | 2/2012 | Dijkmans ............ H03M 3/434 341/143 |
| 2014/0153745 A1 | 6/2014 | Mate |
| 2015/0010157 A1 | 1/2015 | Doller |
| 2015/0078569 A1 | 3/2015 | Magrath et al. |
| 2015/0230018 A1 | 8/2015 | Wen et al. |
| 2016/0133271 A1 | 5/2016 | Kuntzman |
| 2016/0134975 A1 | 5/2016 | Kuntzman et al. |
| 2017/0077911 A1 | 3/2017 | Badillo et al. |
| 2018/0014123 A1 | 1/2018 | Shajaan et al. |
| 2018/0027338 A1 | 1/2018 | Shajaan et al. |

* cited by examiner

SYSTEM AND METHOD FOR CALIBRATING MICROPHONE CUT-OFF FREQUENCY

CROSS-REFERENCE TO RELATED APPLICATIONS

This application is a National Stage Application of PCT/US2018/017458, filed Feb. 8, 2018, which claims the benefit of and priority to U.S. Provisional Patent Application No. 62/459,031, filed Feb. 14, 2017, the entire contents of which are incorporated herein by reference.

BACKGROUND

The following description is provided to assist the understanding of the reader. None of the information provided or references cited is admitted to be prior art.

Microphones are now widely used in a variety of applications, such as, in smartphones, mobile phones, tablets, headsets, hearing aids, sensors, automobiles, etc. Noise reduction in these microphones is a crucial feature for obtaining superior sound quality. Present day microphones have limitations due to their configuration and the way they operate.

DETAILED DESCRIPTION

The present disclosure relates generally to a system and method for more precisely setting a cut-off frequency of a microphone signal. The cut-off frequency is controlled generally by a digital filter in a feedback loop, but precise control of the cut-off frequency requires knowledge of the loop gain. Thus the disclosure also pertains to a system and method for setting or adjusting the loop gain of a microphone signal processing or electrical circuit to better control the microphone's cut-off frequency. The processing circuit includes an amplifier for amplifying a microphone signal, an analog to digital converter for converting the amplified microphone signal into a digital signal, and a decimator for down sampling a frequency of the digital signal. The output of the decimator is then provided to a host processor of a device (e.g., a smartphone) for further processing and use.

The processing circuit also includes a feedback loop and, particularly, an internal feedback loop. The feedback loop returns the output of the decimator back to a combination block via an electrical current digital to analog converter (IDAC). The combination block receives an acoustic signal from a transducer of the microphone and combines that acoustic signal with the output of the feedback loop to obtain the microphone signal, which is then input into the amplifier.

The loop gain of the processing circuit may be adjusted by controlling the amplifier or the IDAC. The amplifier may be controlled by adjusting a gain of the amplifier. The IDAC may be controlled by an analog adjustment of a source current of the current digital to analog converter. The IDAC may also be controlled using a digital adjustment of a gain before (e.g., at an input) the IDAC. By adjusting the loop gain of the processing circuit by using the amplifier or the IDAC, the sensitivity of the microphone and the cut-off frequency of the microphone may be precisely controlled.

Precise control of the cut-off frequency of the microphone signal improves sound quality, enables filtering of low-frequencies that may overload the amplifier, and permits the manufacture of microphones with closely matched/identical cut-off frequencies. Microphones with better matched cut-off frequencies enable better multi-microphone beamforming performance.

Figure 1:
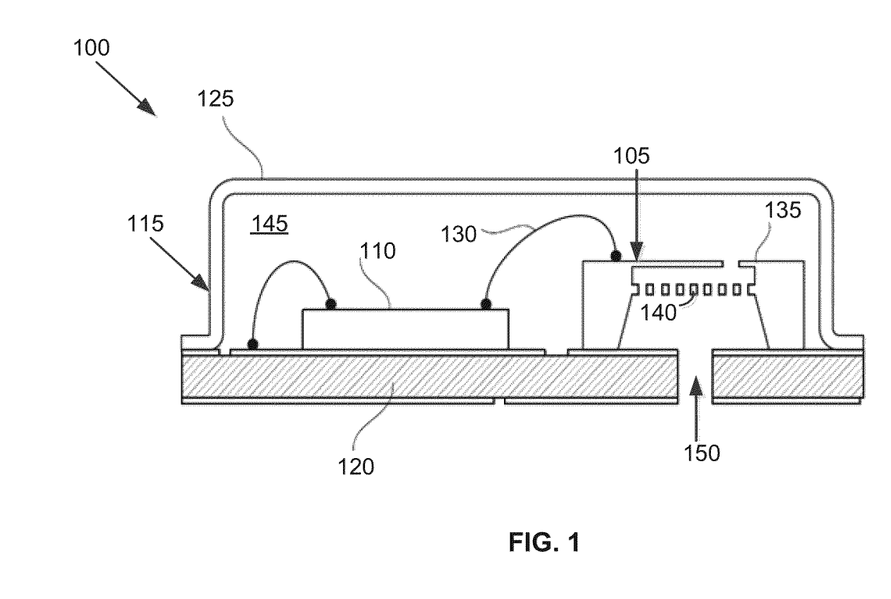
FIG. 1 is a schematic illustration of a microphone assembly.

FIG. 1 is a microphone assembly 100 having a microelectromechanical systems (MEMS) acoustic sensor 105 or die and a processing circuit 110 that converts acoustic signals (e.g., changes in air pressure) into electrical signals. The MEMS sensor 105 may be implemented as a capacitive or condenser sensor, or as a piezoelectric sensor. In FIG. 1, the MEMS die is a capacitive sensor with a backplate 135 and a diaphragm 140. Alternatively, some other acoustic sensor may be used. The microphone assembly 100 includes a housing 115 defining an enclosed volume 145. The housing 115 includes a base 120 and a cover 125 fastened thereto, that encloses and protects the MEMS sensor 105 and the processing circuit 110 disposed therein. A port 150 in the housing 115 permits the MEMS sensor 105 to sense changes in air pressure outside the housing. The base 120 may be embodied as a layered material like FR4 with embedded conductors forming a PCB. The cover 125 may be embodied as a metal can, or a layered FR4 material, which may also include embedded conductors. The cover 125 or lid may also be formed from other materials like plastics and ceramics and may include electromagnetic shielding. In some embodiments, the housing 115 includes external contacts on a surface thereof forming an external device interface for integration with a host device in a reflow or wave soldering operation. In one embodiment, the interface includes power, ground, clock, data, and select contacts. The particular contacts constituting the interface however depend generally on the protocol with which data is communicated between the microphone assembly 100 and the host device. Such protocols include but are not limited to PDM, SoundWire, I2S, and I2C among other known and future protocols.

The processing circuit 110 (also referred to herein as an electrical circuit, an audio signal processing circuit, or audio signal electrical circuit) is configured to receive the acoustic signal from the MEMS sensor 105. The MEMS sensor 105 may be operationally connected to the processing circuit 110 using one or more bond wires 130. In other embodiments, other connecting mechanisms such as, vias, traces, electrical connectors, etc. may be used to electronically connect the MEMS sensor 105 to the processing circuit 110. The processing circuit 110 receives the acoustic signal from the MEMS sensor 105 for further processing and after processing the acoustic signal, the processing circuit provides the processed acoustic signal to another computing or host device (e.g., a smartphone) for use.

Only those components of the microphone assembly 100 that are necessary for a proper understanding of the present disclosure are disclosed herein. Several other components, such as, motors, charge pumps, power sources, filters, resistors, etc., that are desirable or necessary for performing the functions described herein, are contemplated and considered within the scope of the present disclosure.

Additionally, several variations are contemplated and considered within the scope of the present disclosure. For example, although the processing circuit 110 and the MEMS sensor 105 are shown as separate components, in some embodiments, the processing circuit and the MEMS sensor may be integrated together into a single component. In some embodiments, either or both the MEMS sensor 105 and the processing circuit 110 may be constructed from a semiconductor die using, for example, mixed-signal complementary metal-oxide semiconductor devices. In other embodiments, other techniques may be used to construct the MEMS sensor 105 and the processing circuit 110. In some embodiments, the processing circuit 110 may be configured as an application specific integrated circuit (ASIC).

Figure 2:
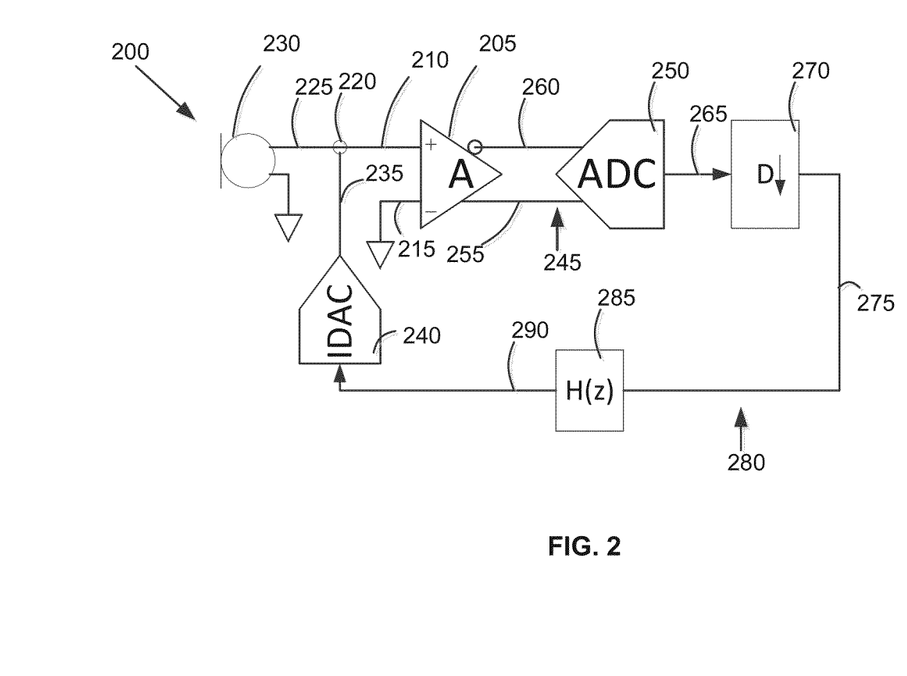
FIG. 2 is a simplified schematic of an electrical circuit of the microphone assembly of FIG. 1.

In FIG. 2, a simplified electrical schematic of a processing circuit 200 includes an amplifier 205 having a first input node 210 and a second input node 215. The first input node 210 receives a microphone signal from a combination block 220, which combines an analog acoustic signal 225 of a transducer 230 (also referred to herein as an acoustic transducer) and an output 235 of an electrical current digital to analog converter (IDAC) 240. The second input node 215 of the amplifier 205 is connected to virtual ground. The processing circuit 200 is shown as a single ended system (e.g., a single output from the transducer 230 and a single output from the IDAC 240) for simplicity. In other embodiments, the processing circuit 200 may be configured as a differential system.

In a differential system, instead of connecting the second input node 215 to virtual ground, the amplifier 205 may be used to support a differential signal from the transducer 230. In a differential system, the transducer 230 is configured to generate two outputs. The second output from the transducer 230 may be an inverted output compared to the acoustic signal 225. Likewise, the IDAC 240 is configured to generate two outputs in a differential system, and the second output may be an inverted signal compared to the output 235 of the IDAC. In a differential system, the second output from the transducer 230 may be combined with the second output from the IDAC 240 in a combination block similar to the combination block 220, and the output of the combination block may be provided to the second input node 215. Thus, in a differential system, the second input node 215 may be connected to a negative differential output (not shown) of the transducer 230 through a negative node (not shown), which also includes a negative output (not shown) from the IDAC 240.

In some embodiments, the combination block 220 is a summation block that sums up the acoustic signal 225 from the transducer 230 with the output 235 from the IDAC 240. In some embodiments, instead of using the combination block 220, the output 235 from the IDAC 240 may be directly connected to the acoustic signal 225 from the transducer 230. As used herein, "directly connected" means through an electrically conductive path without any intervening active devices like transistors, but possibly through passive components like resistors, capacitors, electrical traces, wires, etc. In other embodiments, other mechanisms of combining the acoustic signal 225 from the transducer 230 with the output 235 from the IDAC 240 may be used. Although the combination block 220 has been described as a summation block, in other embodiments, other mechanisms of combining the acoustic signal 225 from the transducer 230 with the output 235 from the IDAC 240 may be used. In some embodiments, the acoustic signal 225 and the output 235 may be subtracted from one another instead of being added. Other functions to combine the acoustic signal 225 with the output 235 may be used as well.

By combining the acoustic signal 225 from the transducer 230 with the output 235 from the IDAC 240, the low frequencies that may otherwise be input into the amplifier may be filtered. Such filtering prevents the amplifier 205 from being overloaded with low frequency components (e.g., noise components) of the acoustic signal 225. By reducing overload at the amplifier 205, the amplifier is able to receive and process the full dynamic range of the microphone signal without unacceptable distortion. In some embodiments, these low frequencies in the acoustic signal 225 from the transducer 230 are suppressed by using the output 235 from the IDAC 240. The output 235 supplies an anti-phase low frequency component that cancels or suppresses the low frequency components of the acoustic signal 225, such that the microphone signal that is input into the first input node 210 is substantially devoid of the low frequency components of the acoustic signal 225.

The amplifier 205 receives the microphone signal at the first input node 210 without (or substantially without) the low frequency components and amplifies the microphone signal into an amplified microphone signal 245, which is then input into an analog-to-digital converter (ADC) 250. The amplifier 205 may be configured with a specified gain. The "gain" of the amplifier 205 means the amplifying ability of the amplifier that, in some embodiments, is expressed as a ratio of the output of the amplifier (e.g., the amplified microphone signal 245) to the input of the amplifier (e.g., the microphone signal at the first input node 210). In some embodiments, the gain of the amplifier 205 is adjusted to attain a more precise cut-off frequency of the microphone assembly 100.

Variations are contemplated in the amplifier 205. In some embodiments, the amplifier 205 is a fully-differential amplifier that generates the amplified microphone signal 245 in a differential or balanced format having a positive signal component 255 and a negative signal component 260. In other embodiments, the amplifier 205 may be a standard amplifier that generates the amplified microphone signal 245 in a single-ended format. In some embodiments, the amplifier 205 may be an alternating current amplifier or a direct current amplifier. Generally speaking, the amplifier 205 may be any amplifier that is suitable for performing the functions described herein. Also, although only a single instance of the amplifier 205 is shown, in some embodiments, multiple instances of the amplifier connected in series or other topologies may be used. Likewise, in some embodiments, the amplifier 205 may use multiple gain stages, filters, or other components that may be deemed necessary or desirable in obtaining the amplified microphone signal 245 to perform the functions described herein.

The amplified microphone signal 245 from the amplifier 205 is input into the ADC 250. The ADC 250 is configured to receive, sample, and quantize the amplified microphone signal 245 and generate a corresponding digital microphone signal 265, which is then input into a decimator 270. Thus, the ADC 250 receives an analog signal (e.g., the amplified microphone signal 245) and converts that analog signal into a digital signal (e.g., the digital microphone signal 265).

The ADC 250 may also be configured in a variety of ways. In some embodiments, the ADC 250 is adapted to output the digital microphone signal in a multibit format. In other embodiments, the ADC 250 is configured to generate the digital microphone signal 265 in a single bit format. In some embodiments, the ADC 250 is based on a sigma-delta converter (IA), while in other embodiments, the ADC is based on any other type of a converter, such as a flash ADC, a data-encoded ADC, a Wilkinson ADC, a pipeline ADC, etc. The ADC 250 may be also configured to generate the digital microphone signal 265 at a specific sampling frequency or sampling rate. In some embodiments, the sampling frequency of the digital microphone signal 265 may lie between 2 MHz and 20 MHz, such as 3.072 MHz. In other embodiments, the sampling frequency may vary.

The ADC 250 may input the digital microphone signal 265 into the decimator 270. The decimator 270 down-samples the digital microphone signal 265 to reduce the size of data (also referred to as data rate) of the digital microphone signal. In some embodiments, the decimator 270 may down-sample the digital microphone signal 265 by reducing the sampling frequency of the digital microphone signal. For example, the decimator 270 may down-sample the digital microphone signal 265 from a 3.072 MHz frequency to about 384 KHz. In other embodiments, the decimator 270 may down-sample to other frequencies depending upon the sampling frequency of the digital microphone signal 265 and the down-sampled frequency that is desired. After down-sampling, the decimator 270 outputs a down-sampled microphone signal 275.

Although not shown, in some embodiments, the down-sampled microphone signal 275 may be transmitted as input to other components (e.g., an interpolator, a digital-to-digital converter, etc.) for further processing before being input into a host processor of a receiving device (e.g., smartphone) for use. The down-sampled microphone signal 275 may also be provided to a feedback loop 280. The feedback loop 280 provides the down-sampled microphone signal 275 back to the first input node 210 of the amplifier 205 via at least a digital loop filter 285, the IDAC 240, and the combination block 220.

The down-sampled microphone signal 275 may be input into the digital loop filter 285 of the feedback loop 280. The digital loop filter 285 filters the down-sampled microphone signal 275 in accordance with an adjustable or fixed transfer function to generate a digital feedback signal 290, which is then input into the IDAC 240. The IDAC 240 may be used to either source current to or sink current from a capacitive element (not shown) connected to the output 235 of the IDAC. The IDAC 240 may convert the digital feedback signal 290, which is digital in nature, to a signal that is analog in nature. The IDAC 240 may also be configured in a variety of ways. In some embodiments, the IDAC 240 may be composed of a plurality of individually controllable current generators that may be selectively configured to source or sink current. Other configurations of the IDAC 240 are also contemplated and considered within the scope of the present disclosure.

The output 235 of the IDAC 240 is fed back into the combination block 220. Thus, the feedback loop 280 supplies an analog feedback signal (e.g., the output 235) back to the combination block 220, where it is combined with the acoustic signal 225 from the transducer 230 and input back into the first input node 210 of the amplifier 205.

Although only the digital loop filter 285 and the IDAC 240 have been shown in the feedback loop 280, in some embodiments, additional or different components may be provided. In some embodiments, the feedback loop 280 may include pulse-width and pulse-amplitude modulators, filters, other digital-to-analog converters, amplifiers, etc. Likewise, although only the amplifier 205, the ADC 250, and the decimator 270 have been shown in the processing circuit outside of the feedback loop 280, other components such as, filters, modulators, etc. that may be deemed desirable or necessary to perform the functions described herein may be used. Additionally, although only single instances of the ADC 250, the decimator 270, the digital loop filter 285, and the IDAC 240 are shown, in some embodiments, multiple instances of one or more of those components may be used in the processing circuit 200. In some embodiments, one or more of the components described above may be integrated together as a single component.

Again, by using the feedback loop 280 and combining the output 235 from the feedback loop with the acoustic signal 225 from the transducer 230 in the combination block 220 before inputting the microphone signal into the first input node 210 of the amplifier 205, the processing circuit 200 effectively prevents low-frequency overload at the amplifier 205 and/or the ADC 250. The low frequency components in the acoustic signal 225 from the transducer 230 may be undesirable noise components that may be caused by, for example, exposure of the microphone assembly 100 to intense subsonic or low frequency sounds generated by wind noise, large machinery, etc. By suppressing these low frequency components in the acoustic signal 225, the processing circuit 200 eliminates the vulnerability of the amplifier 205 to low frequency component induced overload and distortion caused by saturation and non-linearity of active amplification elements like transistors of the amplifier.

The undesirable low frequency components in the acoustic signal 225 from the transducer 230 may be expressed in terms of a cut-off frequency (also referred to as a roll-off frequency). In some embodiments, the cut-off frequency may be set such that all frequency components below the cut-off frequency are deemed as the undesirable low frequency components that may be suppressed by using the output 235 without compromising, and possibly improving, the sound quality of the resulting microphone signal. Thus, the noise floor of the microphone assembly 100 may be adjusted by varying the cut-off frequency response of the transducer 230. Depending upon the application in which the microphone assembly 100 is used, the cut-off frequency of the microphone may vary.

Conventionally, the cut-off frequency of a microphone (e.g., the microphone assembly 100) has been adjusted using an analog filter. When using an analog filter, the cut-off frequency is typically set during manufacture and once set, cannot be changed. Thus, the cut-off frequency is not easily programmable when an analog filter is used. In other conventional approaches, a digital filter in the microphone (e.g., the microphone assembly 100) may be used. The digital filter is also typically programmed during manufacture to set a specific cut-off frequency and, may or may not, be programmable. As noted above, however, precise control of the cut-off frequency requires knowledge of the loop gain.

Figure 3:
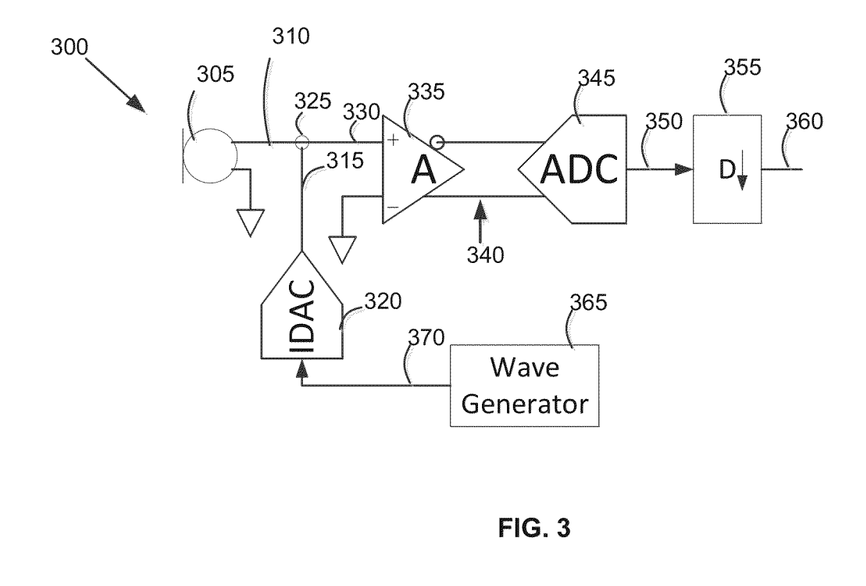
FIG. 3 is another simplified schematic of an electrical circuit of the microphone assembly of FIG. 1.

In FIG. 3, a processing circuit 300 includes a transducer 305 whose acoustic signal 310 is combined with an output 315 of an IDAC 320 in a combination block 325 before being input as a microphone signal into a first input node 330 of an amplifier 335. The amplifier 335 amplifies the microphone signal to generate an amplified microphone signal 340, which is then input into an ADC 345. The ADC 345 converts the amplified microphone signal 340, which is analog in nature, to a digital microphone signal 350.

The digital microphone signal 350 from the ADC 345 is input into a decimator 355 for down-sampling. Down-sampled microphone signal 360 from the decimator 355 is then forwarded for additional processing and use (e.g., to a host processor of a receiving device). In contrast to the processing circuit 200 of FIG. 2, which includes the feedback loop 280, the feedback loop in the processing circuit 300 of FIG. 3 is broken or, in other words, open. Specifically, the down-sampled microphone signal 360 from the decimator 355 is not fed back into the combination block 325 via a digital loop filter (e.g., the digital loop filter 285) and the IDAC 320. Rather, in the processing circuit 300, a wave generator 365 that generates a reference waveform or signal having a known amplitude and frequency, is connected to an input 370 of the IDAC 320.

The reference signal from the wave generator 365 may be used to set the loop gain by calibrating the IDAC 320 and, particularly, by calibrating a source current or gain of the IDAC. By calibrating the source current or gain of the IDAC 320, the cut-off frequency of the microphone assembly 100 may be set more precisely. The wave generator 365 may be any type of wave generator that is capable of generating sinusoidal or square wave forms.

The processing circuit 300 may be configured to include several variations. Similar to the processing circuit 200, the configuration of the various components of the processing circuit 300 may vary from one embodiment to another. Other or additional components that may be needed or desired to perform the functions described herein may also be used in the processing circuit 300.

Figure 4:
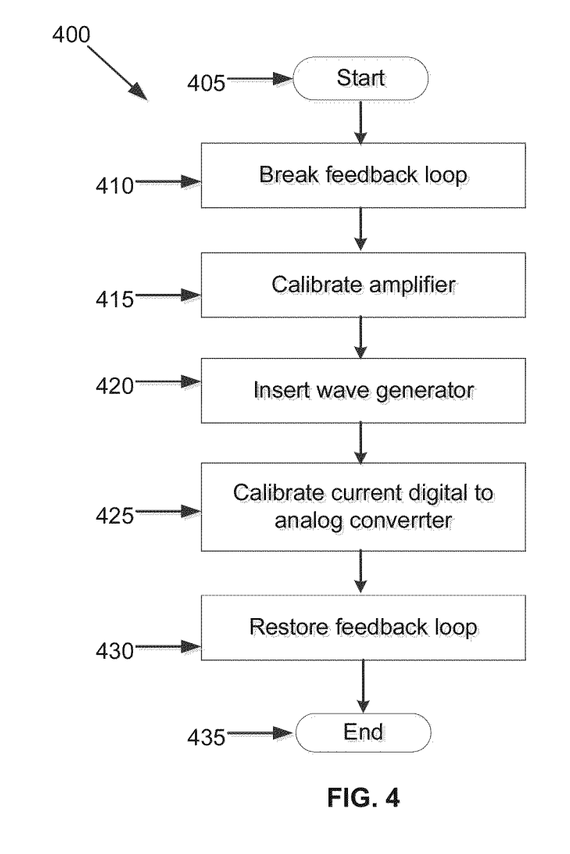
FIG. 4 is a flowchart outlining operations for calibrating a cut-off frequency of the microphone assembly of FIG. 1.

In FIG. 4, a flowchart outlining operations of a process 400 for adjusting the cut-off frequency of a microphone signal (e.g., from the microphone assembly 100) is shown. The cut-off frequency of the microphone signal may be adjusted by adjusting a loop gain of the processing circuit (e.g., the processing circuit 200). The loop gain of the processing circuit may be adjusted, at least in part, by calibrating the IDAC (e.g., the IDAC 240) or at least in part by calibrating the amplifier (e.g., the amplifier 205). Further, by calibrating the amplifier the sensitivity of the microphone may be adjusted.

After starting at operation 405, the feedback loop of the processing circuit is broken at operation 410. In FIG. 2, the feedback loop 280 is broken by disconnecting the down-sampled microphone signal 275 from the decimator 270 and removing the digital loop filter 285 from the feedback loop. In FIG. 4, the amplifier is calibrated at operation 415. In some embodiments, the amplifier may be calibrated before breaking the feedback loop. Thus, the order of the operation 410 and operation 415 may be switched or reversed. The amplifier is calibrated by adjusting a gain of the amplifier. In some embodiments, the cut-off frequency is also dependent upon the size of the input capacitor in the transducer and any parasitic capacitances of the MEMS sensor. The impact of the input and parasitic capacitances on the cut-off frequency may also be attenuated by adjusting the gain of the amplifier. The calibration of the amplifier is discussed in FIG. 5.

At operation 420, the wave generator is inserted into the processing circuit. In FIG. 2, the wave generator is inserted by removing the digital loop filter 285 from the feedback loop 280 and connecting the wave generator at the input of the IDAC, as shown in FIG. 3. In FIG. 4, at operation 425, the IDAC is calibrated. The IDAC is calibrated by adjusting a current of the IDAC, either by adjusting the value of a current source (analog adjustment) or by adjusting a gain of the input to the IDAC (digital adjustment). The calibration of the IDAC is discussed in FIG. 6. After calibrating the IDAC, the feedback loop is restored at operation 430. In FIG. 2, the feedback loop 280 is restored by disconnecting the wave generator and connecting the digital loop filter 285 back into the feedback loop to receive the down-sampled microphone signal 275 from the decimator 270 and to output the digital feedback signal 290 into the IDAC 240. Thus, the configuration of the processing circuit 200 is restored after calibrating the IDAC. The process 400 of FIG. 4 then ends at operation 435.

Although the process 400 shows the calibration of the amplifier before the calibration of the IDAC, in some embodiments, the IDAC may be calibrated before the amplifier is calibrated. Advantageously, by calibrating the amplifier before calibrating the IDAC, the cut-off frequency that is desired to be set by calibrating the IDAC may be accurately (or substantially accurately) determined to also account for the various capacitance tolerances (e.g., the parasitic capacitance) that are accounted for during calibration of the amplifier. Further, in some embodiments, the calibration of the amplifier occurs using an external tone (e.g., signal), and the calibration of the IDAC to adjust the cut-off frequency occurs using an internal test tone (e.g., signal). Thus, the amplifier may be calibrated along any operation of the process 400 so long as the amplifier may be calibrated using an external tone, and the IDAC may be calibrated using an internal test tone. For example, in some embodiments, the amplifier may be calibrated between the operation 420 and the operation 425, or as discussed above, before the operation 410. In some embodiments, the calibrations of the amplifier and the IDAC may occur at the same (or substantially same) time using two separate frequency signals.

Additionally, in some embodiments, the calibrations of the amplifier and the IDAC, and controlling of the cut-off frequency of the microphone signal may be made either internally on chip or externally on a host processor.

Thus, adjusting the cut-off frequency of the microphone signal involves two types of calibrations: a first calibration of the amplifier and a second calibration of the IDAC. In other words, adjusting the cut-off frequency involves calibrating the processing circuit by calibrating the amplifier and calibrating the IDAC.

Figure 5:
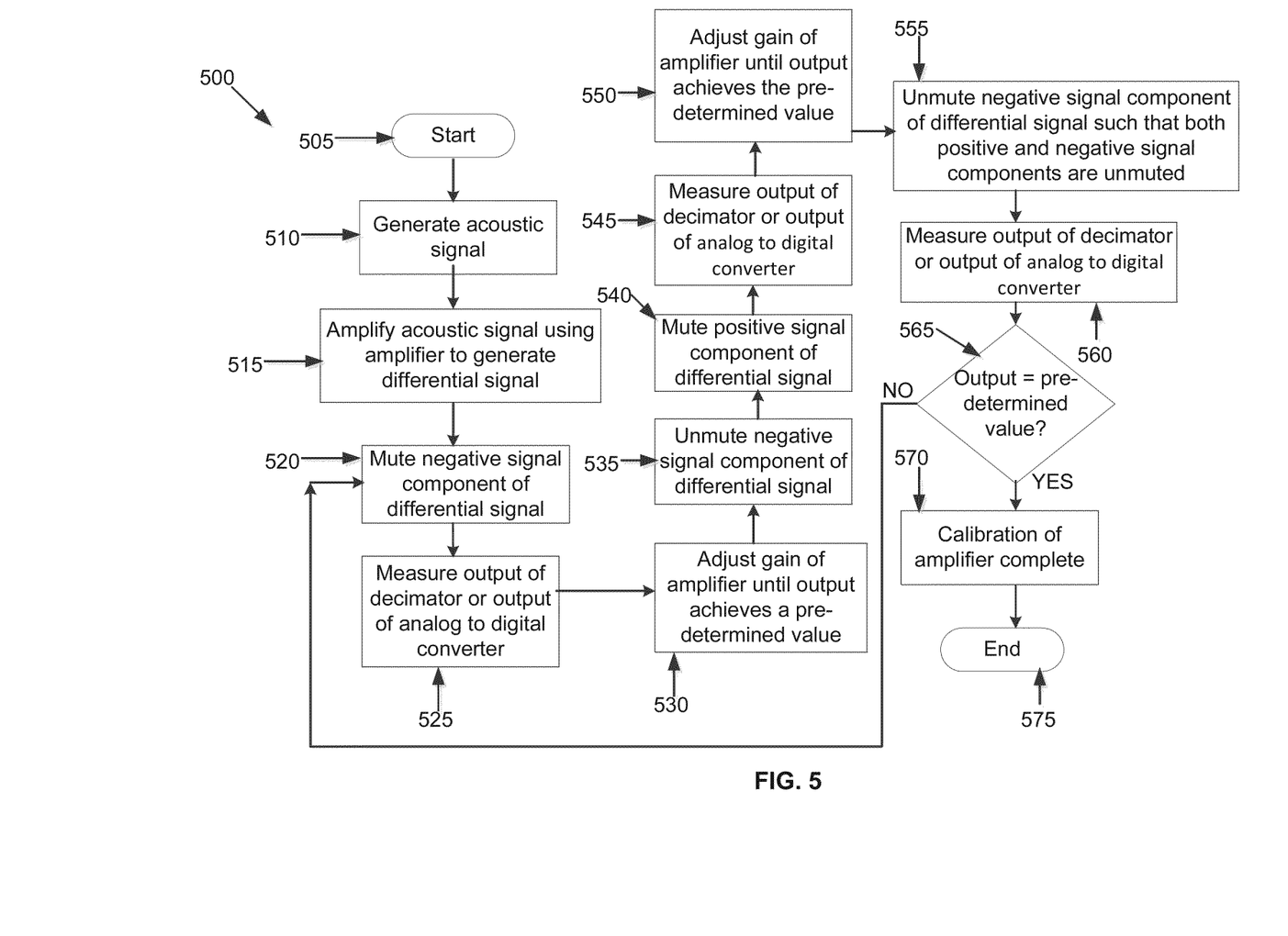
FIG. 5 is another flowchart outlining operations for calibrating an amplifier of the electrical circuit of FIGS. 2 and 3.

In FIG. 5, a flowchart outlining operations of a process 500 for calibrating the amplifier 335 is shown. The purpose of calibrating the amplifier 335 is to adjust a sensitivity of the microphone (e.g., the microphone assembly 100) such that the level above the cut-off frequency is the same. The amplifier 335 is calibrated by adjusting the gain of the amplifier. In some embodiments, the gain of the amplifier 335 is adjusted to also adjust (e.g., reduce) the impact of the parasitic capacitance and other tolerance capacitances of the microphone assembly 100 to achieve a higher quality acoustic output (e.g., the down-sampled microphone signal 275). When the amplifier 335 generates a differential output (e.g., the amplified microphone signal 340), each of the negative and positive components (e.g., the positive signal component 255 and the negative signal component 260 of the amplified microphone signal 245) of the differential output may have a parasitic capacitance associated therewith. In those cases, the gain of the amplifier 335 for each of the negative and positive components may need to be adjusted to account for the parasitic capacitance of those components.

Thus, after starting at operation 505, an acoustic signal is generated at operation 510. The acoustic signal is the acoustic signal 310 from the transducer 305. In some embodiments, the acoustic signal may be generated using a charge pump. In other embodiments, other mechanisms to generate the acoustic signal may be used.

The acoustic signal 310 is combined with the output 315 of the IDAC 320 in the combination block 325 to obtain a microphone signal. In those embodiments in which the feedback loop 280 is broken before the calibration of the amplifier 335, the output 315 from the IDAC 320 may be zero or close to zero (e.g., because the wave generator 365 is not generating an input signal for the IDAC, which in turn is not generating the output 315), such that the output (e.g., the microphone signal) of the combination block 325 is substantially equivalent to the acoustic signal 310, which is input along the first input node 330 of the amplifier 335. In those embodiments in which the feedback loop 280 is broken after the amplifier 335 is calibrated, the acoustic signal 310 may be combined with the output 315 from the IDAC 320 before being input as the microphone signal along the first input node 330 of the amplifier. In some embodiments, a ninety four decibel sound pressure level one kilohertz (94 dBSPL @ 1 kHz) signal may be used as the acoustic signal 310. In other embodiments, an acoustic signal of a different intensity may be used.

The acoustic signal is amplified by the amplifier 335 at operation 515 to obtain an amplified microphone signal. The amplified microphone signal may be a differential signal having a positive signal component and a negative signal component. The amplified microphone signal is converted into a digital microphone signal by the ADC 345, and down-sampled by the decimator 355. Before starting the calibration process of the amplifier 335, in some embodiments, it is determined whether the processing circuit 300 is operating as intended or not.

The output (e.g., the down-sampled microphone signal 360) of the decimator 355 may be measured to confirm that the processing circuit 300 is operating as intended. For example, in some embodiments, if there is a response (e.g., an audible response) measured from the output (e.g., the down-sampled microphone signal 360) of the decimator 355 in response to the microphone signal, the processing circuit 300 is operating properly. If no response is measured from the output (e.g., the down-sampled microphone signal 360) of the decimator 355, then the processing circuit 300 may be malfunctioning and may need to be repaired before the amplifier 335 may be calibrated.

If a response is measured from the output (e.g., the down-sampled microphone signal 360) of the decimator 355, then at operation 520, the process of calibrating the amplifier 335 starts. In some embodiments, the output of the ADC 345 may be used for determining whether the processing circuit 300 is operating as intended or not, as well as for making the various measurements described below for calibrating the amplifier. The amplifier 335 may be configured to generate a differential signal having a positive signal component and a negative signal component. The gain of the amplifier 335 for each of the negative signal component and the positive signal component is adjusted to calibrate the amplifier.

Thus, at the operation 520, the negative signal component of the amplified microphone signal 340 is muted. In some embodiments, the negative signal component may be muted by connecting that component to a virtual ground. In other embodiments, other mechanisms to mute the negative signal component may be used such that the value of the negative signal component is essentially zero. By muting the negative signal component of the amplified microphone signal 340, only the positive signal component of the amplified microphone signal is input into the ADC 345. The ADC 345 converts the positive signal component of the amplified microphone signal 340 into a digital signal, which is then down-sampled by the decimator 355 to produce the down-sampled microphone signal 360.

The down-sampled microphone signal 360 of the decimator 355 is measured at operation 525. In some embodiments, the output of the ADC 345 is measured at the operation 525. In some embodiments, the down-sampled microphone signal 360 or the output of the ADC 345 may be measured by measuring the level (e.g., a root mean square value) around a test tone either with filtering or using a fast Fourier transform value. In other embodiments, other mechanisms of measuring the down-sampled microphone signal 360 or the output of the ADC 345 may be used. By measuring the down-sampled microphone signal 360 of the decimator 355 (or the output of the ADC 345), a sensitivity of the microphone assembly 100 may be calculated.

The sensitivity of the microphone assembly 100 is a function of the acoustic signal 310, the down-sampled microphone signal 360 of the decimator 355 (or the output signal of the ADC 345), and the gain of the amplifier 335. By measuring the down-sampled microphone signal 360 of the decimator 355 (or the output of the ADC 345) for the acoustic signal 310 of the operation 510, and knowing the gain of the amplifier 335, the sensitivity of the microphone assembly 100 may be calculated. If the calculated sensitivity is not within a desired range, the gain of the amplifier 335 may be adjusted until the desired sensitivity of the microphone assembly 100 is achieved.

Thus, calibration of the amplifier 335 results in an adjustment of the sensitivity of the microphone assembly 100. By adjusting the sensitivity of the microphone assembly 100, the noise levels to which the microphone assembly 100 may be sensitive may be adjusted. The sensitivity of the microphone assembly 100 may be adjusted such that the microphone assembly may ignore frequency components below the cut-off frequency of the microphone assembly. Depending upon the application in which the microphone assembly 100 is being used, a high or a low sensitivity may be desired. Generally speaking, a microphone assembly with a higher sensitivity produces a higher output voltage at the down-sampled microphone signal 275 and, therefore, requires a smaller gain at the amplifier 335. On the other hand, a microphone assembly with a lower sensitivity produces a lower output voltage at the down-sampled microphone signal 275 and, therefore, requires, a bigger gain at the amplifier 335. Accordingly, the sensitivity of the microphone assembly 100 may be adjusted to achieve the cut-off frequency that is desired.

Thus, at operation 530, the calculated sensitivity of the microphone assembly 100 is compared with a pre-determined or reference value, which corresponds to the desired sensitivity of the microphone assembly. If the calculated sensitivity does not correspond to (e.g., match or fall within a range of) the desired sensitivity, the gain of the amplifier 335 is adjusted until the desired sensitivity value of the microphone assembly 100 is achieved. In some embodiments, the gain of the amplifier 335 may be changed in increments of one quarter of a decibel (0.25 dB). In other embodiments, the gain of the amplifier 335 may be changed in other increments. In each iteration of changing the gain of the amplifier 335, the down-sampled microphone signal 360 is measured and the sensitivity of the microphone assembly 100 calculated, until the desired sensitivity of the microphone assembly is achieved.

In some embodiments, instead of incrementally changing the gain of the amplifier 335 until the desired sensitivity is achieved, a look-up table may be used to determine the gain of the amplifier corresponding to a desired level of the sensitivity of the microphone assembly 100. By using a look-up table, instead of having to incrementally increase or decrease the gain of the amplifier 335, and calculate the sensitivity value of the microphone assembly 100, the look-up table may be used to determine the correct gain of the amplifier in a single step for the desired sensitivity value. In some embodiments, if the desired sensitivity value is not in the look-up table, the look-up table may still be used to find a gain that is closer to the desired sensitivity and then the gain of the amplifier may be incrementally changed until the desired sensitivity is achieved, thereby minimizing the number of iterations. Thus, the desired sensitivity of the microphone assembly 100 may be achieved faster by using a look-up table.

Once the gain of the amplifier 335 is adjusted for the positive signal component of the amplified microphone signal 340, the negative signal component that was muted at the operation 520 is unmuted at operation 535. In some embodiments, the negative signal component may be unmuted by removing the virtual ground connection or reversing the mechanism that was used to mute the component.

At operation 540, the positive signal component of the amplified microphone signal 340 is muted. Again, the positive signal component may be muted by connecting that component to virtual ground or by using another mechanism. At this point, the negative signal component of the amplified microphone signal 340 is unmuted and the positive signal component is muted. The process of adjusting the gain of the amplifier 335 is now repeated for the negative signal component at operation 545 and operation 550 until the calculated sensitivity of the microphone assembly 100 corresponds to the pre-determined or reference value, which reflects the desired sensitivity of the microphone assembly.

In some embodiments, the process of adjusting the gain of the amplifier 335 for the negative signal component may be started by setting the gain of the amplifier to a gain value that was determined at the operation 530 for the positive signal component. In other embodiments, a different gain value may be used as a starting point. Again, a look-up table may be used in some embodiments. Also, in some embodiments, the gain value of the amplifier 335 may be the same for both the negative and positive signal components. In other embodiments, the gain value for the negative signal component may be different from the gain value of the positive signal component. The gain of the amplifier 335 is continuously adjusted until the desired microphone sensitivity is achieved.

After achieving the desired sensitivity of the microphone assembly 100 on the negative signal component of the output of the amplifier 335, at operation 555, the positive signal component that was muted at the operation 540 is unmuted. With both the negative and positive signal components unmuted, the down-sampled microphone signal 360 (or the output of the ADC 345) is again measured at operation 560. If the down-sampled microphone signal 360 (or the output of the ADC 345) at the operation 560 corresponds with the pre-determined value (that reflects the desired sensitivity of the microphone assembly 100) at operation 565, the calibration of the amplifier 335 is complete at operation 570 and the process 500 ends at operation 575. If, at the operation 565, the sensitivity of the microphone assembly 100 is not as desired, the process 500 returns to the operation 520 and the gain of the amplifier 335 is again set for each of the positive and negative signal components of the amplified microphone signal 340, until the desired sensitivity is attained.

Various modifications to the process 500 are contemplated and considered within the scope of the present disclosure. For example, although the process 500 describes muting the negative signal component of the amplified microphone signal 340 and adjusting the gain of the amplifier 335 for the positive signal component first, in other embodiments, the positive signal component may be muted to adjust the gain of the amplifier for the negative signal component first. Additionally, in those embodiments in which the amplifier 335 generates a single-ended amplified microphone signal, the gain of the amplifier may be adjusted without having to mute/unmute signal components.

Although the process 500 has been described as using a look-up table with values of gain of the amplifier 335 corresponding to various sensitivity values, in some embodiments, other or additional look-up tables may be used. For example, in some embodiments, a look-up table with values of the down-sampled microphone signal 360 (or values of the output of the ADC 345) corresponding to the sensitivity of the microphone assembly 100 may be used, such that instead of calculating the sensitivity of the microphone each time after measuring the down-sampled microphone signal (or the output of the ADC 345), the look-up table may be used to determine the sensitivity corresponding to the measured down-sampled microphone signal (or the output of the ADC). Additionally, in some embodiments, the desired sensitivity for the negative signal component (e.g., the pre-determined value at the operation 530) may be different from the desired sensitivity (e.g., the pre-determined value at the operation 550) of the positive signal component, which in turn may be different from the overall sensitivity (e.g., the pre-determined value at the operation 565) that is desired. In some embodiments, the pre-determined values at the operation 530 and the operation 550 may be set such that the pre-determined value at the operation 565 is achieved.

In some embodiments, it may be desirable to wait for some time (e.g. a few fractions of a second) in between various operations of the process 500. For example, in some embodiments, it may be desirable to wait for about twenty milliseconds (20 msec) between muting the negative or the positive signal components and measuring the down-sampled microphone signal 360 at the output of the decimator 355. By waiting between two operations, any trace signals from the previous iteration may be dissipated, preventing erroneous measurements of the down-sampled microphone signal 360. Other variations to perform the operations of the process 500 may be made in other embodiments.

In some embodiments, the control of the calibration process of the amplifier 335 may be external where the control and measurements are made externally to calibrate the amplifier, or may be internal on startup or when a host processor requests calibration of the microphone assembly 100. A benefit of the process 500 is that a differential MEMS element (e.g., the microphone assembly 100) with possible different gains in each of the positive and negative sides may be calibrated using the process discussed above.

Figure 6:
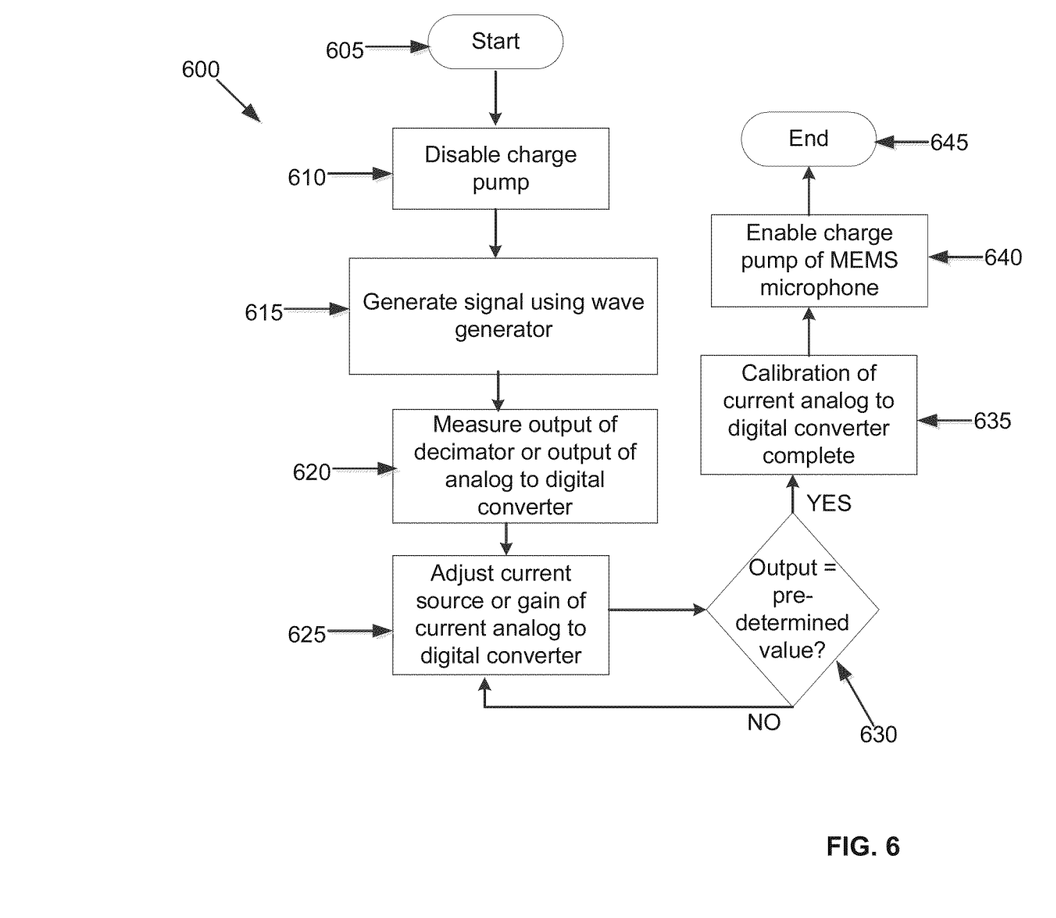
FIG. 6 is yet another flowchart outlining operations for calibrating a current digital to analog converter of the electrical circuit of FIGS. 2 and 3.

In FIG. 6, a flowchart outlining operations of a process 600 may be used to calibrate the IDAC 320. After starting at operation 605, the acoustic signal 310 is disabled at operation 610. In some embodiments, the acoustic signal 310 may be disabled by disabling the charge pump of the microphone assembly 100. In other embodiments, other mechanisms of disabling the acoustic signal 310 may be used. It is desirable to perform the process 600 in a quiet environment to avoid interferences from any stray sound or noise signals that may impact the calibration of the IDAC 320. In some embodiments, the calibration of the IDAC 320 may be performed in a sound box (the charge pump may not need to be disabled when calibrating within a sound box). In other embodiments, other mechanisms to block undesirable noise and sound may be used before calibrating the IDAC 320.

Before calibrating the IDAC 320, the feedback loop 280 is broken and the wave generator 365 is inserted into the broken feedback loop. Specifically, the wave generator 365 is connected to the input 370 of the IDAC 320. At operation 615, the wave generator 365 generates a sinusoidal signal to be input into the IDAC 320 via the input 370. In some embodiments, the wave generator 365 may be used to generate a one kilohertz (1 kHz) sinusoidal wave with no attenuation. In other embodiments, signals of other intensities may be generated by the wave generator 365. Furthermore, although the wave generator 365 has been described as generating a sinusoidal signal, in other embodiments, the wave generator may generate a square signal that may be used to calibrate the IDAC 320.

The signal generated by the wave generator 365 is input into the IDAC 320 via the input 370. At operation 620, the output (e.g., the down-sampled microphone signal 360) of the decimator 355 or the output of the ADC 345 is measured. Again, the output of the decimator 355 or the output of the ADC 345 may be measured by measuring the root mean square (RMS) value around the test tone either by filtering or using the fast Fourier transform measurement. From the measured value of the down-sampled microphone signal 360 (or the value of the output of the ADC 345), it is determined whether a source current of the IDAC 320 or a gain of an input to the IDAC needs to be adjusted to attain the desired cut-off frequency of the microphone assembly 100. Generally, either the source current or the gain of the input to the IDAC 320 is used to calibrate the IDAC.

At operation 625 and operation 630, the value of the down-sampled microphone signal 360 (or the value of the output of the ADC 345) is compared with a pre-determined or reference value. If the value of the down-sampled microphone signal 360 (or the value of the output of the ADC 345) is outside a specific percentage of the pre-determined value, then the source current or gain of the input to the IDAC 320 is adjusted again. In some embodiments, a percentage of between, and including, thirty and forty six percent (30-46%) may be used for comparing the down-sampled microphone signal 360 (or the value of the output of the ADC 345) with the pre-determined value. In other embodiments, a percentage of between, and including, one and five percent (1-5%) may be used. In yet other embodiments, different percentage ranges may be used for comparing the down-sampled microphone signal 360 (or the value of the output of the ADC 345) with the pre-determined value.

The source current of the IDAC 320 or the gain of the input to the IDAC is incrementally adjusted until the value of the down-sampled microphone signal 360 (or the value of the output of the ADC 345) corresponds with (e.g., matches with or falls within the specified range of) the pre-determined value. Thus, the IDAC 320 may be calibrated by adjusting a current of the IDAC by adjusting either a value of the source current of the IDAC (analog adjustment) or by adjusting the gain of the input to the IDAC (digital adjustment).

The pre-determined value is a value of the down-sampled microphone signal 360 (or the value of the output of the ADC 345) that corresponds to the desired cut-off frequency of the microphone assembly 100. By adjusting the source current of the IDAC 320 or the gain of the input to the IDAC until the down-sampled microphone signal 360 (or the value of the output of the ADC 345) corresponds to the pre-determined value, the desired cut-off frequency may be achieved. In some embodiments, the pre-determined value may be determined from a look-up table, such that for each desired cut-off frequency, the look-up table may include a corresponding pre-determined value for the down-sampled microphone signal 360. In other embodiments, other mechanisms to determine the pre-determined value may be used.

In some embodiments, a specific range of the pre-determined value may be defined, such that if the value of the down-sampled microphone signal 360 (or the value of the output of the ADC 345) falls within that range, the IDAC 320 is deemed calibrated. In some embodiments, a range of thirty to forty-six percent (30-46%) or a range of one to five percent (1-5%) of the pre-determined value may be used, while in other embodiments, other range values may be used. In other embodiments, no ranges may be used and it may be desirable for the value of the down-sampled microphone signal 360 (or the value of the output of the ADC 345) to correspond very closely to the pre-determined value. Thus, the range of acceptability of the down-sampled microphone signal 360 (or the value of the output of the ADC 345) may vary from one embodiment to another, depending upon the desired cut-off frequency and the pre-determined value that the down-sampled microphone signal is compared against.

Thus, at the operation 630, the value of the down-sampled microphone signal 360 (or the value of the output of the ADC 345) is compared with the pre-determined value. If the value of the down-sampled microphone signal 360 (or the value of the output of the ADC 345) is within the acceptable range of the pre-determined value, then the process 600 proceeds to operation 635, where the calibration of the IDAC 320 is deemed complete. If at the operation 630, the value of the down-sampled microphone signal 360 (or the value of the output of the ADC 345) is not within the specified range of the pre-determined value, the process 600 returns to the operation 625, where the source current of the IDAC 320 or the gain of the input to the IDAC is adjusted and the value of the down-sampled microphone signal 360 (or the value of the output of the ADC 345) is measured again. The process of adjusting the source current or the gain of the IDAC 320 and measuring the value of the down-sampled microphone signal 360 (or the value of the output of the ADC 345) is continued until the value of the down-sampled microphone signal (or the value of the output of the ADC) corresponds to the pre-determined value.

Similar to the calibration of the amplifier 335, in some embodiments, a look-up table may be used to calibrate the IDAC 320. The look-up table may be used to determine the value of the source current or the gain of the IDAC 320. In some embodiments, the look-up table may include cut-off frequencies and corresponding source current or gain values for the IDAC 320. By knowing the cut-off frequency, the corresponding source current or gain value of the IDAC 320, or the closest source current or gain value of the IDAC corresponding to the desired cut-off frequency may be determined from the look-up table, making the calibration of the IDAC go faster.

After calibrating the IDAC 320 at the operation 635, the charge pump or other mechanism that supplies the acoustic signal 310 is enabled (if it was disabled), at operation 640. The process 600 ends at operation 645.

By calibrating the amplifier 335 and the IDAC 320, the loop gain of the processing circuit 200 is adjusted to set a desired cut-off frequency of the microphone assembly 100. By setting the cut-off frequency of the microphone assembly 100, frequencies below the cut-off frequency may be filtered out by the processing circuit 200 (e.g., at the combination block 220), thereby filtering out at least some of the noise in the acoustic signal 225 from the transducer 230 and improving the quality of the down-sampled microphone signal 275. In some embodiments, the calibration of the amplifier 335 and the IDAC 320 may be performed at start up (e.g., when the microphone assembly 100 is assembled or factory calibrated), during manufacture of the microphone, or even periodically after assembling when the microphone is not being used by the application in which the microphone is incorporated.

Figure 7A:
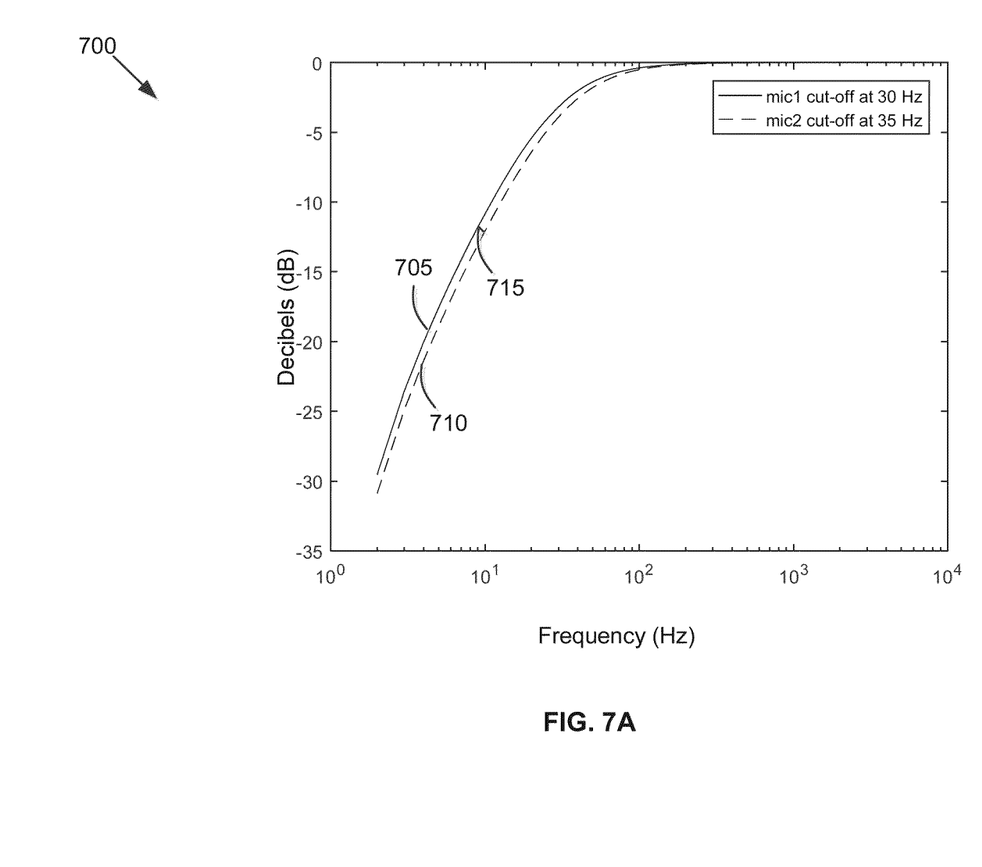
FIG. 7A is a Cartesian graph illustrating impact on beamforming using two microphone assemblies having varying cut-off frequencies.

FIG. 7A is a graph 700 illustrating impact on beamforming using two microphones with varying cut-off frequencies. The graph 700 shows a signal 705 of a first microphone and a signal 710 of a second microphone, with each microphone having a varying cut-off frequency. The signal 705 of the first microphone has a cut-off frequency of about thirty hertz (30 Hz) and the signal 710 of the second microphone has a cut-off frequency of about thirty-five hertz (35 Hz). Even though there is only a five hertz (5 Hz) difference between the cut-off frequencies of the signal 705 and the signal 710, the small difference in the cut-off frequencies may introduce a phase difference 715 between the signals when the signals are combined together for beamforming.

Difference in the phases of the signal 705 and the signal 710 may lead to sound distortion and noise in the resulting beam (e.g., the composite beam when the beams from the microphones are combined) that may not be acceptable in certain applications, such as in hearing aids. The phase difference 715 between the signal 705 and the signal 710 may be removed or at least minimized by matching the cut-off frequencies of those signals.

Figure 7B:
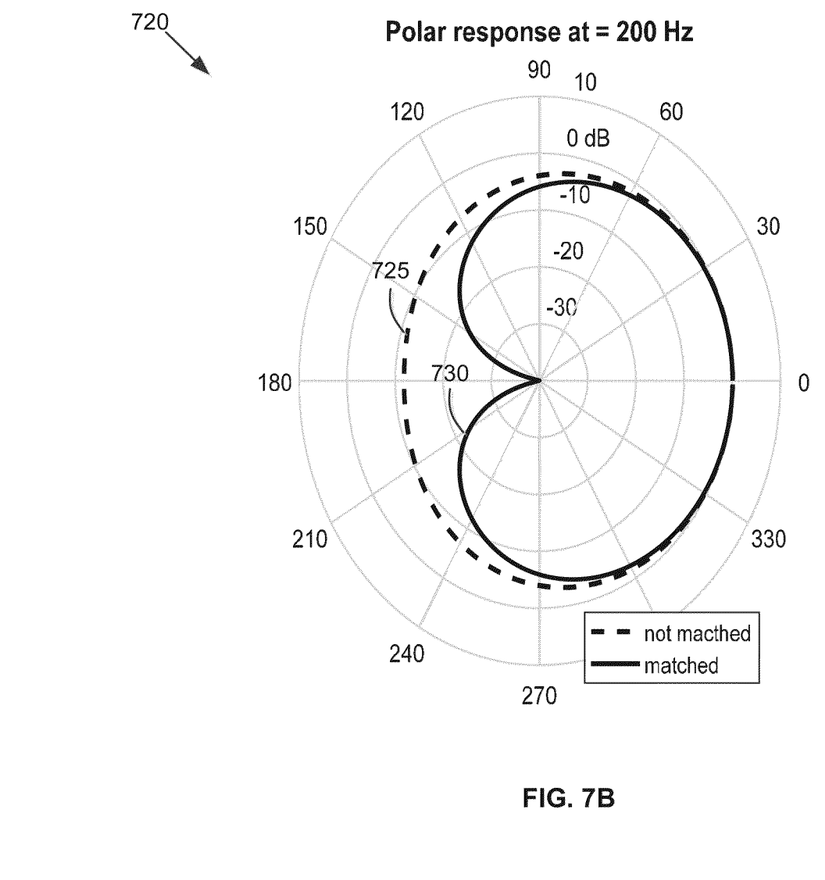
FIG. 7B is a polar plot illustrating a comparison of a composite beam formed using two microphone assemblies having matched cut-off frequencies with another composite beam formed using two microphone assemblies having un-matched cut-off frequencies.

In FIG. 7B, a polar plot 720 shows how certain frequencies are reproduced when they enter a microphone from different angles. The polar plot 720 plots a first composite beam 725 against a second composite beam 730. The first composite beam 725 is formed from at least two microphone signals having different cut-off frequencies, while the second composite beam 730 is formed from at least two microphone signals having same (or substantially same) cut-off frequencies. The plot of the first composite beam 725 appears on the polar plot 720 as an omni-directional response that picks up sound, including noise, from all directions. The plot of the second composite beam 730 appears on the polar plot 720 as a cardioid response, meaning that the composite beam picks up sounds from a front direction and some sound from a rear direction, while filtering out sounds from other directions. Thus, for a same acoustic signal of about two hundred hertz (200 Hz), the first composite beam 725 and the second composite beam 730 generate different responses.

In some applications, such as hearing aids, a superior sound quality with minimal noise distortions may be preferred. In those cases, a cardioid response from a composite beam may be preferred to allow certain sounds while excluding certain sounds. The cardioid response may be obtained by matching the cut-off frequencies of the beams that combine together to make up the composite beam. By matching the cut-off frequencies of signals from two or more microphones to generate a composite beam, a superior sound quality may be achieved.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A method in an audio signal electrical circuit including a feedback loop with a digital filter coupled to a current digital to analog converter, the method comprising:
    providing an output signal from the current digital to analog converter to analog elements of the audio signal electrical circuit, the output signal from the current digital to analog converter based upon a reference signal input to the current digital to analog converter when an output of the digital filter is not input to the current digital to analog converter;
    comparing an output signal of the audio signal electrical circuit to a reference; and
    calibrating the audio signal electrical circuit to correspond the output signal of the audio signal electrical circuit to the reference;
    wherein calibration of the audio signal electrical circuit enables more precise control of a cut-off frequency of a microphone signal when the output of the digital filter is input to the current digital to analog converter.

2. The method of claim 1, further comprising:
    amplifying the output signal from the current digital to analog converter;
    converting the amplified signal to a digital signal, wherein the output signal of the audio signal electrical circuit is the digital signal; and
    calibrating the audio signal electrical circuit until the digital signal corresponds to the reference.

3. The method of claim 1, further comprising:
    amplifying the output signal from the current digital to analog converter;
    converting the amplified signal to a digital signal;
    down-sampling the digital signal into a down-sampled signal, wherein the output signal of the audio signal electrical circuit is the down-sampled signal; and
    calibrating the audio signal electrical circuit until the down-sampled signal corresponds to the reference.

4. The method of claim 1, wherein calibrating the audio signal electrical circuit comprises calibrating the current digital to analog converter.

5. The method of claim 4, further comprising:
    combining an analog acoustic signal with the output from the current digital to analog converter when the output of the digital filter is input to the current digital to analog filter; and
    muting the analog acoustic signal before calibrating the current digital to analog converter.

6. The method of claim 1, wherein providing the reference signal input into the current analog to digital converter includes providing a reference signal having a known frequency and amplitude.

7. The method of claim 1, further comprising:
amplifying the output signal from the current digital to analog converter with an amplifier; and
calibrating the audio signal electrical circuit by calibrating the amplifier.

8. The method of claim 7, wherein calibrating the amplifier comprises:
adjusting a gain of the amplifier using a first output component of the amplifier until a desired sensitivity is achieved; and
adjusting the gain of the amplifier using a second output component of the amplifier until the desired sensitivity is achieved.

9. An audio signal electrical circuit comprising:
a combination block configured to combine an analog acoustic signal with an output from a current digital to analog converter to obtain a microphone signal;
an amplifier configured to amplify the microphone signal into an amplified microphone signal; and
an analog to digital converter configured to convert the amplified microphone signal into a digital microphone signal;
a feedback loop including a digital filter coupled to an output of the analog to digital converter and to an input to the current digital to analog converter,
wherein a loop gain of the audio signal electrical circuit is calibrated to provide a desired cut-off frequency for the digital microphone signal.

10. The audio signal electrical circuit of claim 9, further comprising a reference signal generator configured to input a reference signal into the current digital to analog converter when the digital filter is decoupled from the current digital to analog converter, wherein the loop gain is calibrated when the reference signal is applied to the current digital to analog converter and the analog acoustic signal is muted.

11. The audio signal electrical circuit of claim 9, further comprising a decimator configured to convert the digital microphone signal into a down-sampled microphone signal, the decimator coupled to the analog to digital converter and to the digital filter.

12. The audio signal electrical circuit of claim 9, wherein the audio signal electrical circuit in combination with a microelectromechanical (MEMS) sensor forms a microphone assembly.

13. The audio signal electrical circuit of claim 9, wherein the current digital to analog converter contributes to the loop gain and the current digital to analog converter is calibrated to provide the desired cut-off frequency for the digital microphone signal.

14. The audio signal electrical circuit of claim 9, wherein the amplifier contributes to the loop gain and the amplifier is calibrated to provide the desired sensitivity.

15. A microphone assembly comprising:
an acoustic transducer;
an audio signal electrical circuit connected to the acoustic transducer and configured to receive an acoustic signal from the acoustic transducer, the audio signal electrical circuit comprising:
a combination block configured to combine the acoustic signal with an output from a current digital to analog converter to obtain a microphone signal;
an amplifier configured to amplify the microphone signal into an amplified microphone signal;
an analog to digital converter configured to convert the amplified microphone signal into a digital microphone signal; and
a digital filter coupled to the analog to digital converter and to the current digital to analog converter;
wherein the amplifier is calibrated to provide a desired sensitivity and wherein the current digital to analog converter is calibrated to provide a desired cut-off frequency of the microphone signal.

16. The microphone assembly of claim 15, further comprising a microphone housing configured to enclose and support the acoustic transducer and the audio signal electrical circuit.

17. The microphone assembly of claim 15, further comprising a base configured to mount the acoustic transducer and the audio signal electrical circuit.

18. The microphone assembly of claim 15, wherein the acoustic transducer comprises a microelectromechanical (MEMS) sensor.

19. The microphone assembly of claim 15, wherein the audio signal electrical circuit further comprises:
a decimator configured to down-sample the digital microphone signal into a down-sampled microphone signal;
wherein the down-sampled microphone signal is configured to be input into a receiving device.

* * * * *